US012013734B2

(12) United States Patent
Spica

(10) Patent No.: US 12,013,734 B2
(45) Date of Patent: *Jun. 18, 2024

(54) USING A THERMOELECTRIC COMPONENT TO IMPROVE MEMORY SUB-SYSTEM PERFORMANCE

(71) Applicant: Micron Technology, Inc., Boise, ID (US)

(72) Inventor: Michael R. Spica, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/884,481

(22) Filed: Aug. 9, 2022

(65) Prior Publication Data

US 2022/0382348 A1 Dec. 1, 2022

Related U.S. Application Data

(63) Continuation of application No. 16/518,267, filed on Jul. 22, 2019, now Pat. No. 11,416,048.

(51) Int. Cl.
*G06F 1/20* (2006.01)
*H05K 1/02* (2006.01)
*H05K 7/20* (2006.01)

(52) U.S. Cl.
CPC ........... *G06F 1/206* (2013.01); *H05K 1/0203* (2013.01); *H05K 7/20272* (2013.01);
(Continued)

(58) Field of Classification Search
CPC ..... H05K 7/20272; H05K 2201/10159; H05K 2201/10522
See application file for complete search history.

(56) References Cited

U.S. PATENT DOCUMENTS

| 5,032,897 A * | 7/1991 | Mansuria ................ H01L 23/38 257/712 |
| 6,512,209 B1 | 1/2003 | Yano |

(Continued)

FOREIGN PATENT DOCUMENTS

| EP | 2740889 A1 * | 6/2014 | ............ E21B 47/011 |
| JP | 2003022135 A | 1/2003 | |
| JP | 2014216512 A | 11/2014 | |

OTHER PUBLICATIONS

International Search Report and Written Opinion dated Oct. 30, 2020, on Application No. PCT/US2020/042921.

(Continued)

*Primary Examiner* — Santosh R Poudel
(74) *Attorney, Agent, or Firm* — Lowenstein Sandler LLP

(57) ABSTRACT

A system receives event information associated with an event that corresponds to a temperature of a memory sub-system including memory devices encased in respective packages. The system determines whether the event information associated with the event satisfies a threshold condition. Responsive to determining that the event information associated with the event satisfies the threshold condition, the system causes a thermoelectric component (TEC) that is coupled to an external surface of each of the respective packages of the memory devices of the memory sub-system to transfer thermal energy between the TEC and the memory devices via thermal conduction.

16 Claims, 6 Drawing Sheets

(52) U.S. Cl.
CPC .............. *H05K 2201/10159* (2013.01); *H05K 2201/10219* (2013.01); *H05K 2201/10522* (2013.01)

(56) References Cited

U.S. PATENT DOCUMENTS

| | | | |
|---|---|---|---|
| 9,123,382 B1 | 9/2015 | Abasto | |
| 2006/0260793 A1* | 11/2006 | Yang | H01L 23/433 257/E23.09 |
| 2007/0153848 A1* | 7/2007 | Fratti | G11B 33/1406 372/36 |
| 2007/0189677 A1 | 8/2007 | Murry et al. | |
| 2008/0099909 A1* | 5/2008 | Baek | H01L 24/24 438/109 |
| 2011/0204229 A1* | 8/2011 | Schamber | H01J 37/256 250/311 |
| 2012/0224425 A1 | 9/2012 | Fai et al. | |
| 2013/0227268 A1 | 8/2013 | Ichida et al. | |
| 2015/0089961 A1 | 4/2015 | Duzly | |
| 2015/0094875 A1 | 4/2015 | Duzly | |
| 2015/0185741 A1* | 7/2015 | Rangarajan | G05D 23/19 700/300 |
| 2016/0062435 A1 | 3/2016 | Arakawa et al. | |
| 2016/0216043 A1* | 7/2016 | Gomez | F28F 13/06 |
| 2016/0377822 A1 | 12/2016 | Zheng et al. | |
| 2017/0003889 A1 | 1/2017 | Kim et al. | |
| 2017/0038805 A1 | 2/2017 | Chun | |
| 2017/0212579 A1 | 7/2017 | Tirumala et al. | |
| 2017/0300423 A1 | 10/2017 | Kamruzzaman | |
| 2017/0374744 A1* | 12/2017 | Babin, Sr. | H05K 7/20445 |
| 2019/0004723 A1 | 1/2019 | Li et al. | |
| 2019/0122704 A1 | 4/2019 | Huang | |
| 2020/0050246 A1* | 2/2020 | Karalnik | G06F 1/3296 |
| 2020/0089292 A1* | 3/2020 | North | G06F 1/206 |
| 2020/0201404 A1 | 6/2020 | Rao | |
| 2021/0298812 A1* | 9/2021 | Sverdlik | A61N 7/00 |

OTHER PUBLICATIONS

Joel Hruska, How do SSDs work? May 3, 2021, https://www/extremetch.com/extreme/210492-extremetech-expalins-how-do-ssds-work. (Year 2021).

Margaret Rouse, Controller, Oct. 23, 2012, https://whatis.techtarget.com/defination/controller?vgnextfmt=print (Year: 2012).

* cited by examiner

USING A THERMOELECTRIC COMPONENT TO IMPROVE MEMORY SUB-SYSTEM PERFORMANCE

RELATED APPLICATIONS

This application is a continuation application of U.S. patent application Ser. No. 16/518,267, filed Jul. 22, 2019, which is incorporated herein by reference.

TECHNICAL FIELD

Embodiments of the disclosure relate generally to memory sub-systems, and more specifically, relate to using a thermoelectric component (TEC) to improve memory sub-system performance.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
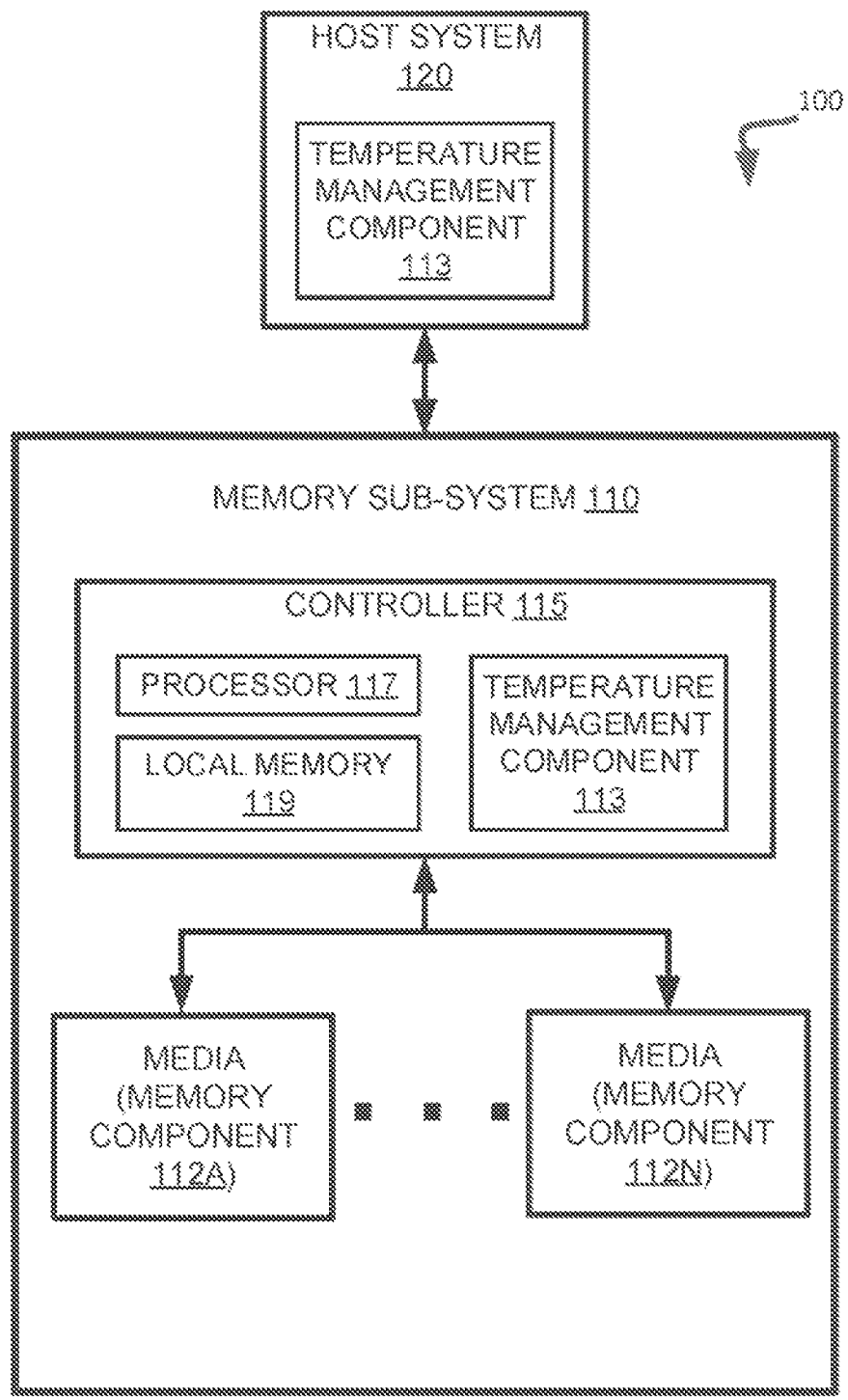
FIG. 1 illustrates an example computing environment that includes a memory sub-system in accordance with some embodiments of the disclosure.

Aspects of the present disclosure are directed to using a thermoelectric component to improve memory sub-system performance. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

Thermal runaway occurs in situations where an increase in temperature changes conditions in a way that can cause a further increase in temperature, often leading to a destructive result. In electronic devices, such a memory sub-systems, thermal runaway can cause catastrophic failure of the electronic devices. Even in situations where thermal runaway is not an immediate issue, operating electronic devices at elevated temperatures can cause degradation in reliability, performance issues, or reduced lifespans.

The overheating of electronic devices has been frequently described with respect to central processing units (CPUs). In comparison, memory sub-systems have generally not been associated with overheating issues. As memory sub-systems continue to shrink in size (e.g., form factor), and the density of components of a memory sub-system increases overheating issues are also affecting memory sub-systems.

Overheating issues associated with memory sub-systems can cause catastrophic failures, reduction in lifespans, as well as performance issues. For example, a personal computer, such as a laptop, can suffer from performance degradation related to the overheating of the personal computer's memory sub-system. In some instances, the problem of overheating can be more acute in a collection of computer servers, such as a server farm, where each computer server is coupled to multiple memory sub-systems that are continuously operated.

In some conventional systems, elevated temperatures of electronic devices have been addressed in multiple ways. Excess heat from conventional systems is often removed using electric fans that force air across the electrical devices to remove excess heat. Passive mechanical heat sinks can also be coupled to the electronic devices and used in conjunction with the electric fans. The passive mechanical heat sinks can conduct thermal energy away from electronic devices efficiently, and often have increased surface area that enable the electric fans to work more efficiently in removing thermal energy.

In some conventional systems, electric fans in combination with heatsinks are not sufficient to address all overheating issues. Some conventional systems use thermal throttling techniques (also referred to as "dynamic frequency scaling") to address some of the overheating issues. For example, when an electronic device generates too much thermal energy the frequency of the electronic device can be decreased so that the dynamic power (e.g., switching power) consumption is reduce. Thermal throttling can reduce the thermal energy generated by an electrical device, but also contributes to performance degradation as the number of operations a memory sub-system can perform while thermally throttled is reduced.

Aspects of the disclosure address the above challenges by receiving event information associated with an event that corresponds to the temperature of a memory sub-system. Whether the first event information satisfies a first threshold condition is determined. Responsive to determining that the first event information satisfies the first threshold condition, a thermoelectric component (TEC) is caused to change from an inactive state to an active state by decreasing a temperature at a bottom surface of the TEC that is coupled to the memory sub-system as a temperature at a top surface of the TEC increases. A TEC can transduce electrical energy into thermal energy, and vice versa. Responsive to applying a voltage potential to the TEC, one surface of the TEC heats while the opposite surface concurrently cools. In some embodiments, electric fans or liquid cooling heatsinks can be used in conjunction with the TECs to remove excess thermal energy from the memory sub-system.

In some embodiments, the host system can be coupled to a server machine that includes multiple memory sub-systems, such as multiple SSDs. Each of the multiple memory sub-systems of the server machine can be coupled to a respective TEC. In some embodiments, the TEC can have a similar form factor as the memory sub-system and be coupled to multiple components of the memory sub-system. In embodiments, each respective TEC of the sever machine can be independently controlled. Responsive to event information associated with a particular memory sub-system of the server machine satisfying a threshold condition, the respective TEC can be changed from the inactive state to the active state. Similarly, after the respective TEC is changed from the inactive state to the active state, subsequent event information associated with the particular memory sub-system can satisfy another threshold condition, which causes the TEC to be changed from the active state to the inactive state. Each of the TECs of the multiple memory sub-system can be operated in a similar manner such that the TECs are independently controlled.

In some embodiments, the cooling operation performed by the TECs can be a reactive operation or a predictive operation. Reactive cooling can refer to causing the TEC to change from an inactive state to an active state based on event information that indicates that the memory sub-system is operating at an elevated temperature. Predictive cooling can refer to causing the TEC to change from an inactive state to an active state based on event information that predicts that the memory sub-system will operate at an elevated temperature in the future. Some reactive events include sub-system temperature of the memory sub-system or a component temperature of one or more components of the memory sub-system. Some predictive events include the number of logical block addresses of a particular memory sub-system that will be used for a memory operation, such as a write operation or read operation.

Being able to address thermal issues of a memory sub-system by controlling the operation of a TEC that is coupled to the memory sub-system improves memory sub-system performance, increases the usable life of the memory sub-system, and prevents catastrophic failures caused by thermal runaway. For example, controlling the operation of the TEC can cause the coupled memory sub-system to operate at a temperature or within a temperature range that allows the memory sub-system to be more performant, can cause the coupled memory sub-system to operate at a temperature or within a temperature range that causes less degradation over the usable life of the memory sub-system, and can cause the coupled memory sub-system to operate at a temperature that that reduces the current temperature and prevents the memory sub-system from entering thermal runaway.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

In embodiments, the memory sub-system 110 includes a temperature management component 113 that performs operations as described herein. In some embodiments, the host system 120 includes the temperature management component 113. In some embodiments, the memory sub-system 110 includes the temperature management component 113. In some embodiments, the temperature management component 113 can be part of host system 120, controller 115, memory component 112N, an operating system (OS) (e.g., OS of host system 120), or an application (e.g., user-space application executed at host system 120). Temperature management component 113 can control the operation of thermoelectric components (TECs) that are coupled to the memory sub-system 110 in view of event information associated with an event that corresponds to a temperature of the memory sub-system 110. For example, the controller 115 can include a processor 117 (processing device) configured to execute instructions stored in local memory 119 for performing the operations described herein. In another example, the host system 120 includes a processing device configured to execute instructions stored on a local memory associated with host system 120 for performing the operations described herein.

Figure 2A:
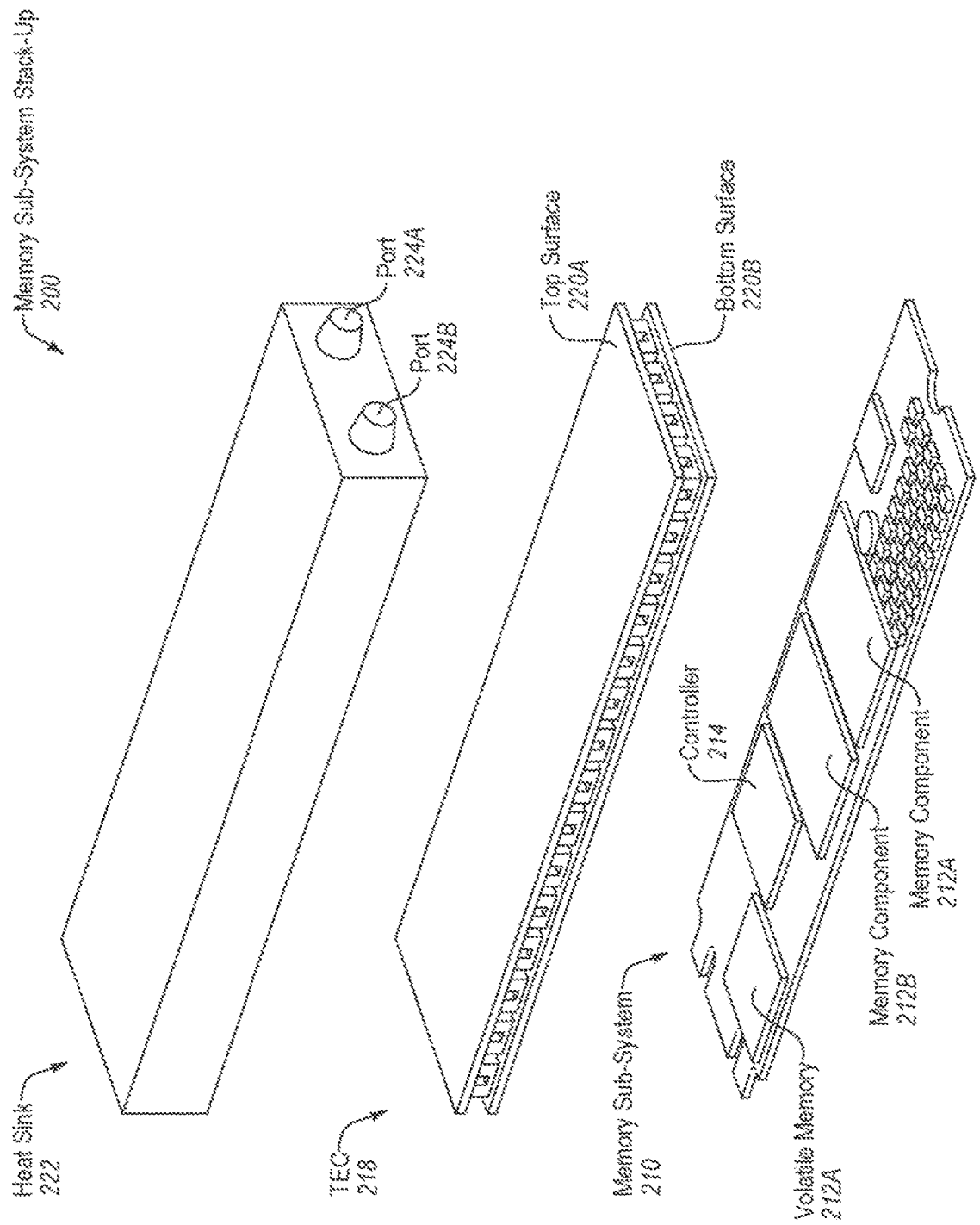
FIG. 2A illustrates a memory sub-system stack-up, in accordance with embodiments of the disclosure.

FIG. 2A illustrates a memory sub-system stack-up, in accordance with embodiments of the disclosure. In embodiments, memory sub-system stack-up 200 includes memory sub-system 210, thermoelectric component (TEC) 218, and heatsink 222. In some embodiments, the heat sink 222 is an optional component of memory sub-system stack-up 200. Memory sub-system stack-up 200 is illustrated with relative positional relationships, top and bottom, for purposes of illustration rather than limitation. It can be noted that assigning other positional relationships to memory sub-system stack-up 200 and the elements of the memory sub-system stack-up 200 is within the scope of the disclosure.

Memory sub-system 210 can be similar to memory sub-system 110 described with respect to FIG. 1, and can include any aspects described with respect to memory sub-system 110. In some embodiments, memory sub-system 210 can include one more memory components, such as memory component 212A and 212B. In some embodiments, memory components 212A and 212B are non-volatile memory components. In some embodiments, memory component includes controller 214. Controller 214 can be similar to controller 115 described with respect to FIG. 1, and can include any aspects described with respect to controller 115. In some embodiments, memory sub-system 210 includes volatile memory 216, such as DRAM. In some embodiment, memory sub-system 210 is a memory drive, such as SSD.

In some embodiments, memory sub-system 210 has a specific form factor. A memory form factor can describe the physical dimensions of the memory sub-system (e.g., size), and also pin configuration. In one example, memory sub-system 210 can be designed consistent with the Next Generation Form Factor (NGFF) specification (also referred to as "M.2"). The NGFF includes a specification for internally mounted computer expansion cards and associated connectors. The NGFF specification can include physical specifications for a memory sub-system that allows for different module widths and lengths. In some embodiments, the M.2 dimensions can be 80 millimeters (mm) in length and 22 mm in width and 1.35 mm in height. In some embodiments, the M.2 form factor can provide volume reduction for memory sub-systems as compared to other larger form factors, such as the 2.5 inch form factor. A memory sub-system in the 2.5 inch form factor is approximately 98 mm in length, 68 mm in width, and 7-9 mm in height. The volume of a memory sub-system in a M.2 form factor is approximately 23,144 mm$^3$ and a memory sub-system in a 2.5 inch form factor is approximately 46, 648 mm$^3$. It can be noted that a memory sub-system in a M.2 form factor is described for purposes of illustration, rather than limitation. Aspects of the disclosure can be used with memory sub-system of any form factor, and can be used with any electrical devices, generally.

In some embodiments, the memory sub-system stack-up 200 can include a thermoelectric component (TEC) 218 (also referred to as a "thermoelectric cooler"). In some embodiments, the TEC 218 has a top surface 220A and a bottom surface 220B. Responsive to applying a voltage potential to the TEC one surface of the TEC heats while the opposing surface concurrently cools. A TEC 218 can transduce electrical energy into thermal energy, and vice versa. In some embodiments, the TEC 218 can utilize a Peltier effect to apply a heating or cooling effect at a surface of TEC 218 that is coupled to the memory sub-system 210. For example, a bottom surface 220B of the TEC 218 can contact the packages of the components of the memory sub-system 210 to transfer thermal energy to and from components of the memory sub-system. In some embodiments, the TEC 218 can be a Peltier device. In some embodiments, the TEC 218 can include an array of alternating n-type and p-type semiconductors disposed between two plates, such as two ceramic plates. A voltage applied to the TEC 218 causes one plate to cool while the opposing plate heats.

In embodiments, TEC 218 can be in an inactive state or an active state. In an inactive state, no or immaterial current is consumed by the TEC 218. For instance, a voltage potential is not applied to the TEC 218 in an inactive state. In the inactive state, the top surface and the bottom surface do not actively change temperature. In the inactive state, the TEC 218 is off or idle. In an active state, a voltage potential is applied to the TEC 218 and the TEC consumes current. In the active state, one surface of the TEC 218 cools and the opposite surface heats. The surface that heats and the surface that cools depend on the polarity of the voltage potential applied to the TEC 218. In embodiments, the surface that contacts the memory sub-system 210 is cooled while the surface facing away from the memory sub-system 210 is heated responsive to the TEC 218 being in the active state.

In some embodiments, the TEC 218 can be coupled to the memory sub-system 210 using a thermal interface material, such as thermally conductive adhesive, thermal greases, phase change materials, thermal tapes, gap filling thermal pads, thermal epoxies, and so forth. For example, a thermal interface material can be disposed between the bottom surface 220A of TEC 218 and the top surface of memory sub-system 210. In some embodiments, the thermal interface material can have at least a minimum conductivity of 150 Watts per meter-Kelvin (W/mk) or greater.

In some embodiments and as noted above, the bottom surface 220B of the TEC 218 can be coupled to a surface of the memory sub-system 210. For example, the bottom surface 220B of the TEC 218 can contact the package surfaces of the various components of the memory sub-system 210 to exchange thermal energy. In embodiments, a single TEC can contact multiple components of the memory sub-system 210. In some embodiments, the single TEC has a similar form factor as the underlying memory sub-system 210. For example, if the memory sub-system 210 has a M.2 form factor, the TEC 218 can have a similar form factor such that the width and length of the TEC 218 are similar to the width and length of the memory sub-system 210. In some embodiments, the TEC 218 can be smaller than the underlying memory sub-system 210 and contact multiple components of the memory sub-system 210, but not all the components of the memory sub-system 210. For example, the TEC can contact two or more of memory component 212A, memory component 212B, controller 214, or volatile memory 216. The TEC can have a similar width to the memory sub-system 210 but can be shorter in length than the memory sub-system 210. In other embodiments, multiple TECs can be used for a single memory sub-system 210. For example, different TECs can be used at each of the memory components 212A and 212B.

In some embodiments, memory sub-system stack-up 200 can include a heat sink 222. The heat sink 222 can include a top surface and a bottom surface. In some embodiments, the heat sink 222 is an active heat sink, such as a liquid cooling heat sink. In some embodiments, a liquid cooling heat sink can have two ports, and input port 224A and an output port 224B (generally referred to as "ports 224"). The input port 224A can deliver a liquid to the heat sink 222. The output port 224B can remove liquid from the heat sink 222. The ports 224 can be coupled to other heat sinks or directly to a liquid reservoir. The liquid can circulate between the liquid reservoir and the liquid cooling heat sink. As the liquid circulates through the liquid cooling heat sink, heat from the underlying electronic device is transferred from the electronic device to the liquid. As the liquid in the heat sink 22 is heated, new cooler liquid is circulated through the heat sink 222. The liquid eventually is circulated back to the reservoir where the liquid is cooled.

In some embodiments, the heat sink 222 is a passive heat sink. For example, the heat sink can be a thermally conductive metal, such as a sheet of thermally conductive metal that is coupled to the top surface 220A of the TEC 218. Thermally conductive materials include, but are not limited to, copper, aluminum, copper brass, or alloys of the aforementioned materials. It can be noted that other thermally conductive materials can be used. In another example, a passive heat sink can have a top surface of the heat sink that has a greater surface area than the bottom surface to help facilitate thermal energy transfer from the heat sink to an adjacent medium (e.g., air in the surrounding environment). In embodiments, the top surface of the heat sink includes multiple channels and multiple fins disposed between the channels. In some embodiments, passive heat sinks can be used in conjunction with electric fans to help remove heat from an underlying device.

In embodiments, the bottom surface of heat sink 222 is coupled to the top surface 220A of TEC 218 to transfer thermal energy from TEC 218 to the heat sink 222. In embodiments, the heat sink 222 and TEC 218 are coupled using a thermal interface material, as described above. In some embodiments, the heat sink 222 has roughly the same dimensions (e.g., length and width) as the underlying TEC 218. The bottom surface of the heat sink 222 contacts a majority if not all of the top surface 220A of the TEC 218. In other embodiments, the heat sink 222, can have any dimensions.

Figure 2B:
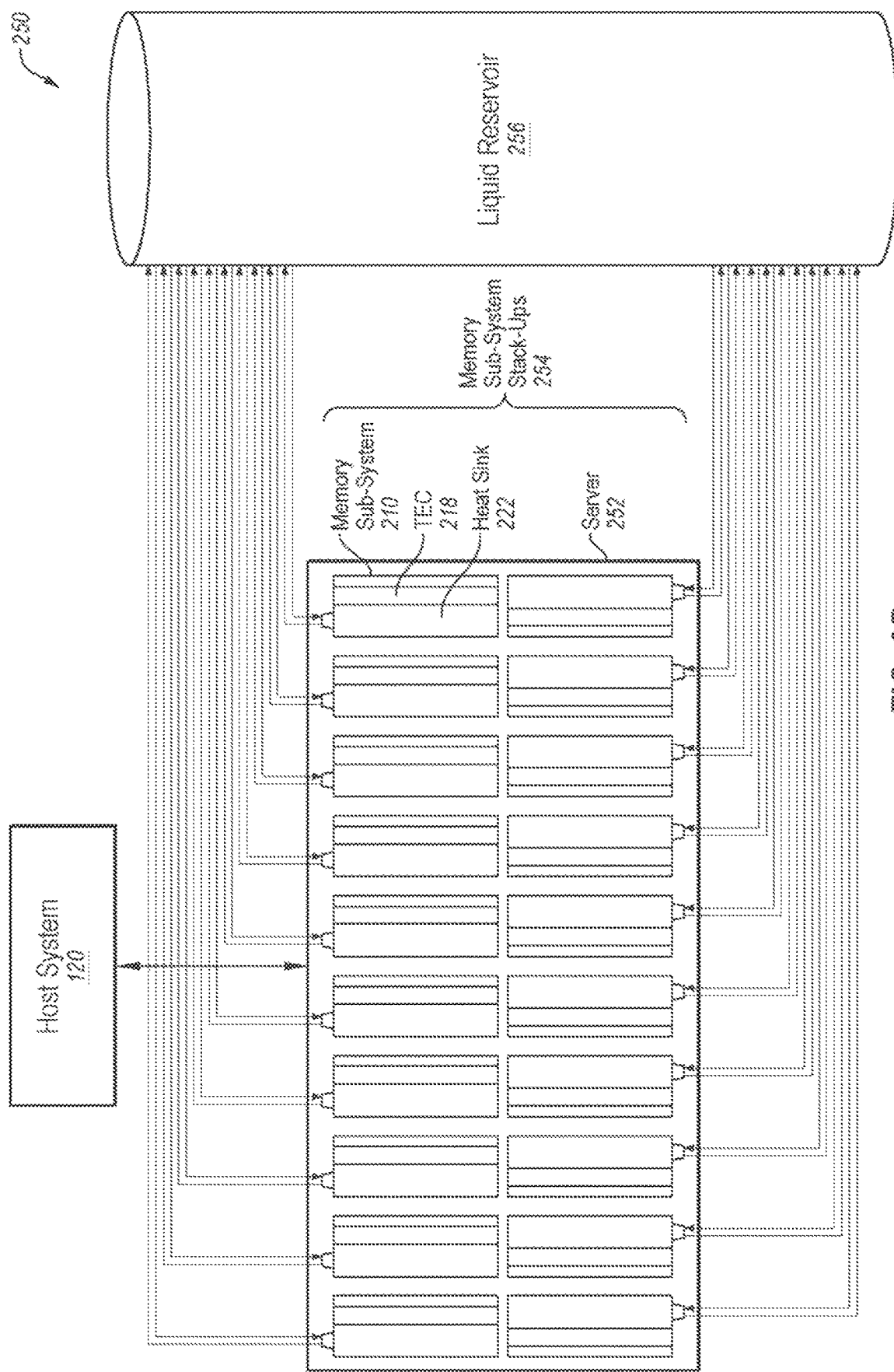
FIG. 2B illustrates an example computing environment that includes multiple memory sub-systems, in accordance with some embodiments of the disclosure.

FIG. 2B illustrates an example computing environment that includes multiple memory sub-systems, in accordance with some embodiments of the disclosure. Computing environment 250 can include similar elements as computing environment 100 of FIG. 1 and memory sub-system stack-up 200 of FIG. 2A. It can be noted that elements of FIG. 1 and FIG. 2A and can be used to help describe FIG. 2B. A single server 252 is provided for purposes of illustration rather than limitation. In embodiments, computing environment 250 includes host system 120, server machine 252 (also referred to as "server" herein), and liquid reservoir 256. In some embodiments, host system 120 can be coupled to one or more servers 252. In some embodiments, liquid reservoir can be coupled to one or more memory sub-system of one or more severs 252. In some embodiments, the liquid cooling heat sinks of the memory sub-system stack-ups 254 are optional elements In embodiments, server 252 can include multiple memory sub-systems, such as multiple SSDs. In some embodiments, server 252 is a rack server. In embodiments, one or more of the memory sub-systems of the server 252 includes a memory sub-system stack-up, such as illustrated in memory sub-system stack-ups 254 of FIG. 2A. For example, a memory sub-system stack-up can include a memory sub-system 210, a TEC 218, and a heat sink 222. Memory sub-system stack-ups 254 illustrate a top-down view of server 252. It can be noted that the memory sub-system stack-ups 254 are illustrated orientated with the sides facing upwards (towards the page) for purposes of illustration, rather than limitation. Memory sub-system stack-ups 254 can have any orientation.

In embodiments, a liquid cooling heat sink is included at one or more of the memory sub-system stack-ups 254. In some embodiments and as noted above, a liquid cooling heat sink can have two ports, and input port and an output port. The input port can receive a liquid from liquid reservoir 256. The output port can remove liquid from the liquid cooling heat sink. The liquid removed to the liquid cooling heat sink can be delivered to the liquid reservoir 256. The liquid can circulate between the liquid reservoir 256 and the liquid cooling heat sinks of the memory sub-system stack-ups 254. As the liquid circulates through the liquid cooling heat sinks, heat from the underlying devices is transferred from the devices to the liquid. The heated liquid is cooled at the liquid reservoir 256. In some embodiments, the liquid from the liquid reservoir 256 is continually circulated to and from server 252. Each of the liquid cooling heatsinks are shown as directly coupled to liquid reservoir 256 for purposes of illustration, rather than limitation. Different configuration can be used in different embodiments. For example, one or more of the liquid cooling heat sinks can be coupled together such that liquid is moved through multiple liquid cooling heatsinks before returning to liquid reservoir 256.

In some embodiments, host system 120 controls the operation of the TECs of the memory sub-system stack-up 254. For example, host system 120 can independently control each of the TECs of the memory sub-system stack-ups 254 of server 252. For instance, host system 120 can set each of the memory sub-system stack-ups 254 in an active state or inactive state responsive to determining event information associated with an event that corresponds to the temperature of each of the memory sub-systems of server 252.

In embodiments where the memory sub-system stack-ups 254 use passive heat sinks, one or more electric fans can be used with server 252. In some embodiments, responsive to changing any of the TECs of the memory sub-system stack-ups 254 to an active state, host system 120 can cause the one or more fans to turn on such that air is forced across the passive heat sinks.

Figure 3:
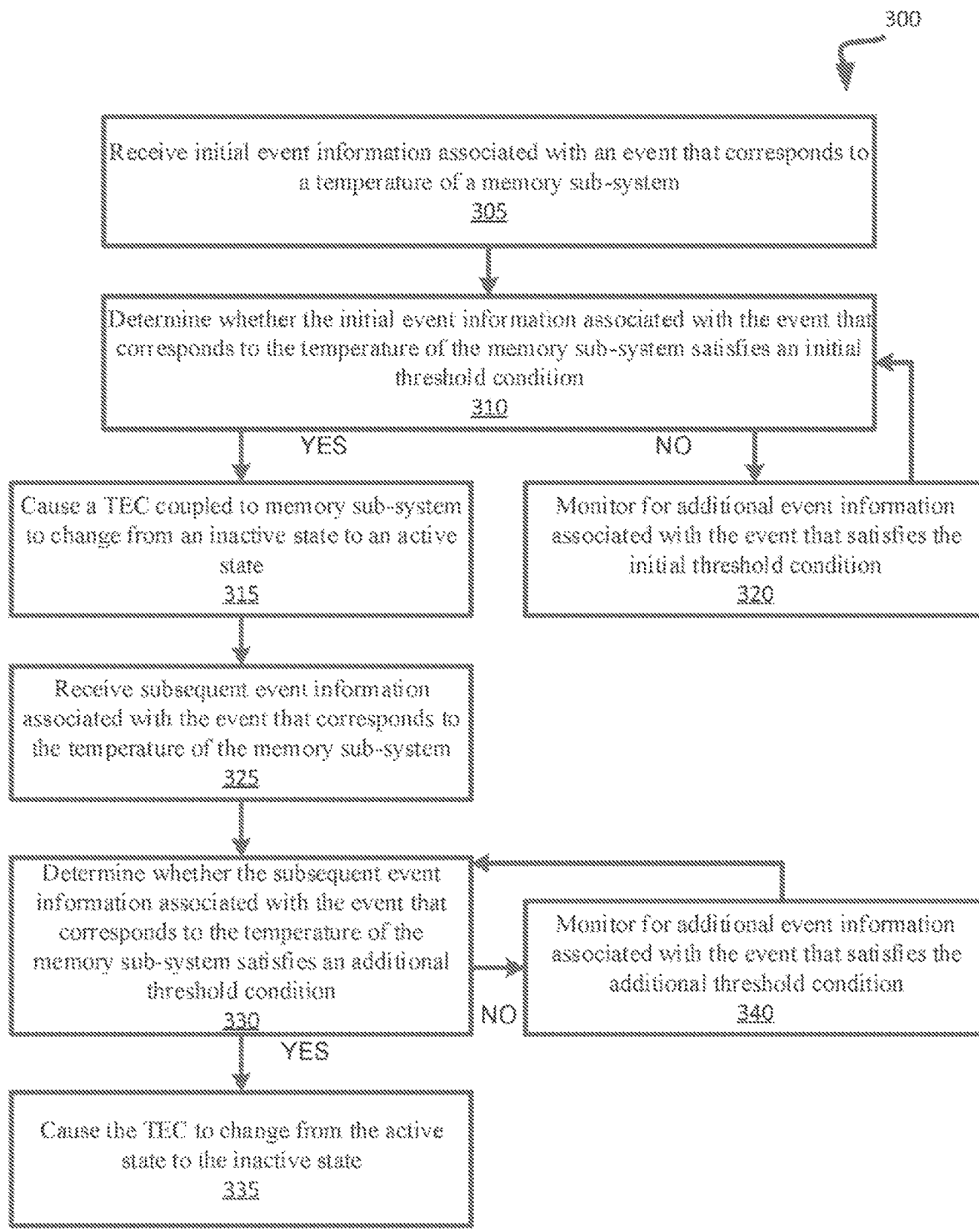
FIG. 3 is a flow diagram of an example method of causing a TEC that is coupled to a memory sub-system to change from an inactive state to an active state and from an active state to an inactive state, in accordance with some embodiments of the disclosure.

FIG. 3 is a flow diagram of an example method 300 of causing a TEC that is coupled to a memory sub-system to change from an active state to an inactive state, and from an inactive state to an active state, in accordance with some embodiments of the disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 300 is performed by the temperature management component 113 of FIG. 1.

In some embodiments, temperature management component 113 (e.g., firmware) executed at controller 115 of memory sub-system 110 performs some or all of the operations described with respect to method 300. In some embodiments, temperature management component 113 executed at host system 120 performs some or all of the operations described with respect to method 300. In some embodiments, temperature management component 113 of host system 120 can be included in at least one of different parts of the host system 120. In one example, temperature management component 113 can be executed as an application in user-space (e.g., third-party application) that is separate from the operating system (OS) (e.g., kernel space) of the host system 120. In another example, the temperature management component 113 can be part of the OS of the host system 120. In still another example, temperature management component 113 can be part of the memory sub-system device driver that is executed at the host system 120.

In embodiments where the temperature management component operates at the host system, the user-space application can send one or more system calls to the OS of the host system 120 requesting information, such as event information of an event that corresponds to a temperature of a memory sub-system. The OS can check whether the information is available at the host system 120. For example, the host system 120 can keep an event log that stores information about the memory sub-system. If the information is not available at the host system 120, the OS can convert the system calls to Application Programming Interface (API) requests that are sent to the memory sub-system device driver(s) at the host system 120. The memory sub-system device driver(s) can receive the API request and send a corresponding command to the memory sub-system to retrieve the information. The memory sub-system device driver can retrieve the requested information. The information can be passed from the memory sub-system device driver to the OS using an API response, and the OS can pass the information back to the user-space application in response to the original system call. It can be noted that if a part of the host system other than the user-space application performs the operations described herein, it can be understood that fewer of the above mentioned communication operations can be performed.

Although shown in a particular order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

At operation 305, processing logic executing method 300 receives initial event information associated with an event that corresponds to a temperature of a memory sub-system. In some embodiments, the event is related to the operation of the memory sub-system where the event currently affects (e.g., reactive) or will affect (e.g., predictive) the temperature of the memory sub-system. In some embodiments, the events can be reactive events or predictive events. In some embodiments, reactive events are associated with the current temperature state of the memory sub-system. With respect to reactive events, the processing logic can react to the current temperature state to control the temperature (e.g., reduce the temperature) of the memory sub-system. In some embodiments, predictive events can be used to predict or estimate the temperature of the memory sub-system at some point in the future, even if the current temperature state is not at a temperature that is to be reduced.

In some embodiments, to receive the initial event information associated with the event that corresponds to the temperature of the memory sub-system, processing logic receives an indication of a sub-system temperature of the memory sub-system. In some embodiments, the sub-system temperature can indicate the temperature of the entire memory sub-system. For example, the memory sub-system can include a discrete temperature sensor, such as a thermistor, that is built into the memory sub-system to measure the temperature of the memory sub-system. In some embodiments, the initial event information can include memory sub-system temperature values (e.g., raw temperature values in Celsius) that can be associated with an event, such as the sub-system temperature, that corresponds to the temperature of the memory sub-system. In some embodiments, a reactive event includes the sub-system temperature of the memory sub-system.

In some embodiments, to receive the initial event information associated with the event that corresponds to the temperature of the memory sub-system, processing logic receives an indication of a component temperature of the memory component of the memory sub-system. In some embodiments, the component temperature can indicate the temperature of a particular component of the memory sub-system. Raw component temperature values can be received that are indicative of the temperature at individual components of the memory sub-system. One or more of the components of the memory sub-system can have on-die or integrated temperature sensors to measure the temperature at the particular components. For example, each of the memory components can include an integrated temperature sensor that measures the on-die temperature of the respective memory component. In some embodiments, the component temperature can be distinct from the memory sub-system temperature. For example, the memory sub-system can report a memory sub-system temperature measured at a thermistor in the memory sub-system, and the can report one or more component temperatures of one or more components of the memory sub-system. In some examples, the reported memory sub-system and component temperatures can vary at a given instance in time. In some embodiments, the initial event information can include component temperature values (e.g., raw temperature values in Celsius) that can be associated with an event, such as the component temperatures of one or more of the components of the memory sub-system that corresponds to the temperature of the memory sub-system. In some embodiments, a reactive event includes the component temperature of at least one component of the memory sub-system.

In some embodiments, to receive the initial event information associated with the event that corresponds to the temperature of the memory sub-system, processing logic receives an indication of a number of logical block addresses (LBA) at which a memory operation at the memory sub-system is to be performed. A memory operation can include, but is not limited to, a write operation or a read operation. In a write operation, host system provides data that is to be written to the memory sub-system. In a read operation, the host system requests data that is to be read at the memory sub-system. In performing the read operation or the write operation, the number of local block addresses and the memory sub-system that includes physical memory associated with the LBAs can be identified (e.g., by the host system or memory sub-system) prior to the execution of the particular memory operation or at least before the execution of the memory operation is completed. A logical block address can refer to a location of a unit (e.g., block) of data stored at a memory sub-system. The logical block address can map to a physical block address associated with the memory sub-system. In some embodiments, the initial event information can include LBAs that can be associated with an event, such as a memory operation, that corresponds to the temperature of the memory sub-system. For example, processing logic can predict that writing a threshold number of LBAs to a particular memory sub-system can cause the memory sub-system to rise in temperature above an undesirable temperature state before the memory sub-system or component of the memory sub-system has actually risen to the undesirable temperature state. In some embodiments, a predictive event includes a memory operation.

At operation 310, processing logic determines whether the initial event information associated with the event that corresponds to the temperature of the memory sub-system satisfies an initial threshold condition. In embodiments, responsive to the initial event information associated with the event that corresponds to the temperature of the memory sub-system satisfying an initial threshold condition, processing logic proceeds to operation 315. In embodiments, responsive to the initial event information associated with the event that corresponds to the temperature of the memory sub-system not satisfying an initial threshold condition, processing logic proceeds to operation 320.

In some embodiments where the event includes the memory sub-system temperature, to determine whether the initial event information associated with the event that corresponds to the temperature of the memory sub-system satisfies the initial threshold condition, processing logic compares the indication (e.g., raw temperature values) of the sub-system temperature of the memory sub-system to a sub-system temperature threshold condition. For example, the sub-system temperature threshold condition can include a predetermined sub-system temperature condition (e.g., 100 degrees Celsius). The raw temperature values indicative of the memory sub-system temperature can be compared to the predetermined sub-system temperature condition.

In embodiments, processing logic can determine whether the sub-system temperature of the memory sub-system meets or exceeds the sub-system temperature threshold condition in view of the comparison. For example, processing logic can determine the raw temperature values indicative of the memory sub-system temperature meet or exceed the predetermined sub-system temperature condition. Responsive to determining that the sub-system temperature of the memory sub-system system meets or exceeds the sub-system temperature threshold condition, processing logic determines that the initial event information (e.g., raw temperature values) satisfy the initial threshold condition, such as the sub-system temperature threshold condition. Responsive to determining that the sub-system temperature of the memory sub-system system is less than the sub-system temperature threshold condition, processing logic determines that the initial event information (e.g., raw temperature values) does not satisfy the initial threshold condition, such as the sub-system temperature threshold condition.

In some embodiments where the event includes a component temperature of at least one component of the memory sub-system, to determine whether the initial event information associated with the event that corresponds to the temperature of the memory sub-system satisfies the initial threshold condition, processing logic compares the indication (e.g., raw temperature values) of the component temperature of a component of the memory sub-system to a component temperature threshold condition. For example, the component temperature threshold condition can include a predetermined component temperature condition (e.g., 90 degrees Celsius). In some embodiments, different components of the memory sub-system can have different or the same predetermined component temperature conditions. The raw temperature values indicative of the component temperature of one or more components of the memory sub-system can be compared to the predetermined component temperature condition.

In embodiments, processing logic can determine whether the component temperature of one or more components of the memory sub-system meets or exceeds the component temperature threshold condition in view of the comparison. For example, processing logic can determine the raw temperature values indicative of the component temperature meet or exceed the predetermined component temperature condition. Responsive to determining that the component temperature of one or more components of the memory sub-system meets or exceeds the component temperature threshold condition, processing logic determines that the initial event information (e.g., raw temperature values) satisfies the initial threshold condition, such as the component temperature threshold condition. Responsive to determining that the component temperature of one or more component of the memory sub-system system is less than the component temperature threshold condition, processing logic determines the that the initial event information (e.g., raw temperature values) does not satisfy the initial threshold condition, such as the component temperature threshold condition.

In some embodiments where the event includes a memory operation that is to be performed at the memory sub-system, to determine whether the initial event information associated with the event that corresponds to the temperature of the memory sub-system satisfies the initial threshold condition, processing logic compares the number of LBAs to a number threshold condition. For example, the number threshold condition can include a predetermined number of LBAs at a particular memory sub-system at which the memory operation is to be performed. In some embodiments, different memory sub-systems can have different or the same predetermined number threshold conditions. The number of LBAs can be compared to the predetermined number threshold condition.

In embodiments, processing logic can determine whether the number of LBAs meets or exceeds the number threshold condition in view of the comparison. For example, processing logic can determine the number of LBAs for a particular memory sub-system on which the memory operation is to be performed meets or exceeds the predetermined number threshold condition. Responsive to determining that the number of LBAs for a particular memory sub-system on which the memory operation is to be performed meets or exceeds the number threshold condition, processing logic determines that the initial event information (e.g., number of LBAs) satisfies the initial threshold condition, such as the number threshold condition. Responsive to determining that the number of LBAs for a particular memory sub-system on which the memory operation is to be performed is less than the number threshold condition, processing logic determines that the initial event information (e.g., number of LBAs) does not satisfy the initial threshold condition, such as the number threshold condition.

At operation 315, responsive to determining that the initial event information associated with the event that corresponds to the temperature of the memory sub-system satisfies the initial threshold condition, processing logic causes a thermoelectric component (TEC) to change from an inactive state to an active state by decreasing a temperature at a bottom surface of the TEC that is coupled to the memory sub-system as a temperature at a top surface of the TEC increases. In some embodiments, the host system can send a signal that turns on a specific TEC that is coupled to a particular memory sub-system to change the TEC from the active state to an inactive state. In embodiments where the temperature management component 113 is executed at the memory sub-system, the memory sub-system can send a signal to the host system that requests the host system to change the TEC associated with the particular memory sub-system from the inactive state to the active state.

In embodiments, where the event is a reactive event causing the TEC to change from the inactive state to an inactive state can cause the underlying memory sub-system to begin cooling from a temperature that exceeds the threshold condition. In embodiments, where the event is a predictive event, causing the TEC to change from the inactive state to the active state can prevent the underlying memory sub-system from reaching an undesirable temperature state.

In some embodiments, one or more of the events described herein can be implemented. In some embodiments, event information for one or more events can be received, and if any event information for any of events satisfies a respective threshold condition, processing logic causes the TEC to change form the inactive state to the active state. In some embodiments, event information for one of more events can be received, and if event information for multiple events satisfies respective threshold conditions, processing logic causes the TEC to change from the inactive state to the active state. For example, if the sub-system temperature of the memory sub-system satisfies the sub-system temperature threshold condition and the number of LBAs at which a memory operation at the memory sub-system is performed satisfies the number threshold condition, processing logic can cause the TEC to change from the inactive state to the active state. In embodiments, any combination of events can be implemented.

At operation 320, responsive to determining that the initial event information associated with the event that corresponds to the temperature of the memory sub-system does not satisfy the initial threshold condition, processing logic monitors for additional event information associated with the event that satisfies the initial threshold condition. In some embodiments, if the initial threshold condition is not satisfied by the additional event information, processing logic can continue to monitor for event information that satisfies the initial threshold condition. For example, the processing logic can query or receive event information at intervals. In another example, the processing logic can query or receive event information based on other criteria. For example, each time a write operation or read operation is performed processing logic can receive an indication of the respective operation and request or receive information that identifies the number of LBAs at which a memory operation at a memory sub-system is to be performed.

At operation 325, processing logic receives subsequent event information associated with the event that corresponds to the temperature of the memory sub-system. Subsequent to changing the TEC from the inactive state to the active state, it can be advantageous to change the TEC back to the inactive state, to conserve energy consumption, for example.

In some embodiments, processing logic can receive new or updated event information with respect to the sub-system temperature of the memory sub-system. For example, processing logic can receive new or updated event information with respect to the component temperature of one or more component of the memory sub-system. The processing logic can receive new or updated event information with respect to the memory operation (e.g., the memory operation at the memory sub-system has been completed).

At operation 330, processing logic determines whether the subsequent event information associated with the event that corresponds to the temperature of the memory sub-system satisfies an additional threshold condition. In can be noted that operation 330 can be similar to operation 310 as described above, and the description with respect to operation 310 applies to operation 330, unless otherwise described. In some embodiments, the additional threshold condition can be different than the initial threshold condition as described with respect to operation 310.

In some embodiments where the event includes the memory sub-system temperature, to determine whether the subsequent event information associated with the event that corresponds to the temperature of the memory sub-system satisfies the additional threshold condition, processing logic compares the indication (e.g., raw temperature values) of the sub-system temperature of the memory sub-system to a sub-system an additional temperature threshold condition. In embodiments, the additional temperature threshold condition can be lower than the initial threshold condition that triggered processing logic to change the TEC from an inactive state to an active state. For example, the initial sub-system temperature threshold condition can include a predetermined sub-system temperature condition (e.g., 100 degrees Celsius) and the additional sub-system temperature condition can be 40 degrees Celsius. The raw temperature values indicative of the memory sub-system temperature can be compared to the additional sub-system temperature condition.

In embodiments, processing logic can determine whether the sub-system temperature of the memory sub-system meets or exceeds the additional sub-system temperature threshold condition in view of the comparison. For example, processing logic can determine the raw temperature values indicative of the memory sub-system temperature meet or exceed the additional sub-system temperature condition. Responsive to determining that the sub-system temperature of the memory sub-system system meets or exceeds the additional sub-system temperature threshold condition, processing logic determines that the subsequent event information (e.g., raw temperature values) satisfies the additional threshold condition, such as the additional sub-system temperature threshold condition. Responsive to determining that the sub-system temperature of the memory sub-system system is less than the additional sub-system temperature threshold condition, processing logic determines the that the subsequent event information (e.g., raw temperature values) does not satisfy the additional threshold condition, such as the additional sub-system temperature threshold condition.

In some embodiments where the event includes a component temperature of at least one component of the memory sub-system, to determine whether the subsequent event information associated with the event that corresponds to the temperature of the memory sub-system satisfies the additional threshold condition, processing logic compares the indication (e.g., raw temperature values) of the component temperature of a component of the memory sub-system to an additional component temperature threshold condition. For example, the component temperature threshold condition can include an additional component temperature condition (e.g., 30 degrees Celsius). In some embodiments, different components of the memory sub-system can have different or the same additional component temperature conditions. The raw temperature values indicative of the component temperature of one or more components of the memory sub-system can be compared to the additional component temperature condition.

In embodiments, processing logic can determine whether the component temperature of one or more components of the memory sub-system meets or exceeds the additional component temperature threshold condition in view of the comparison. For example, processing logic can determine the raw temperature values indicative of the component temperature meet or exceed the additional component temperature condition. Responsive to determining that the component temperature of one or more components of the memory sub-system meets or exceeds the additional component temperature threshold condition, processing logic determines the that the subsequent event information (e.g., raw temperature values) satisfy the additional threshold condition, such as the additional component temperature threshold condition. Responsive to determining that the component temperature of one or more component of the memory sub-system system is less than the additional component temperature threshold condition, processing logic determines the that the subsequent event information (e.g., raw temperature values) does not satisfy the additional threshold condition, such as the additional component temperature threshold condition.

In some embodiments where the event includes a memory operation that is to be performed at the memory sub-system, to determine whether the subsequent event information associated with the event that corresponds to the temperature of the memory sub-system satisfies the additional threshold condition, processing logic can receive an indication that the memory sub-system has completed the memory operation at the particular memory sub-system. In other embodiments, to the temperature of the memory sub-system satisfies the additional threshold condition, processing logic can determine whether an amount of time has elapsed since changing the TEC from an inactive state to an active state (e.g., elapsed time exceeds a time threshold condition). Responsive to determining that receiving an indication the memory operation with respect to the memory sub-system has completed or a threshold amount of time has elapsed, processing logic determines the that the subsequent event information satisfies the second threshold condition. Responsive to not receiving an indication that the memory operation with respect to the memory sub-system has completed or a threshold amount of time has not elapsed, processing logic determines that the subsequent event information does not satisfy the additional threshold condition.

At operation 335, responsive to determining that the subsequent event information associated with the event that corresponds to the temperature of the memory sub-system satisfies the additional threshold condition, processing logic causes the TEC to change from the active state to the inactive state.

At operation 340, responsive to determining that the subsequent event information associated with the event that corresponds to the temperature of the memory sub-system does not satisfy the subsequent threshold condition, processing logic monitors for additional event information associated with the event that satisfies the additional threshold condition. In some embodiments, if the additional threshold condition is not satisfied by the additional event information, processing logic can continue to monitor for event information that satisfies the additional threshold condition. In can be noted that operation 340 can be similar to operation 320 as described above, and the description with respect to operation 320 applies to operation 340, unless otherwise described.

Figure 4:
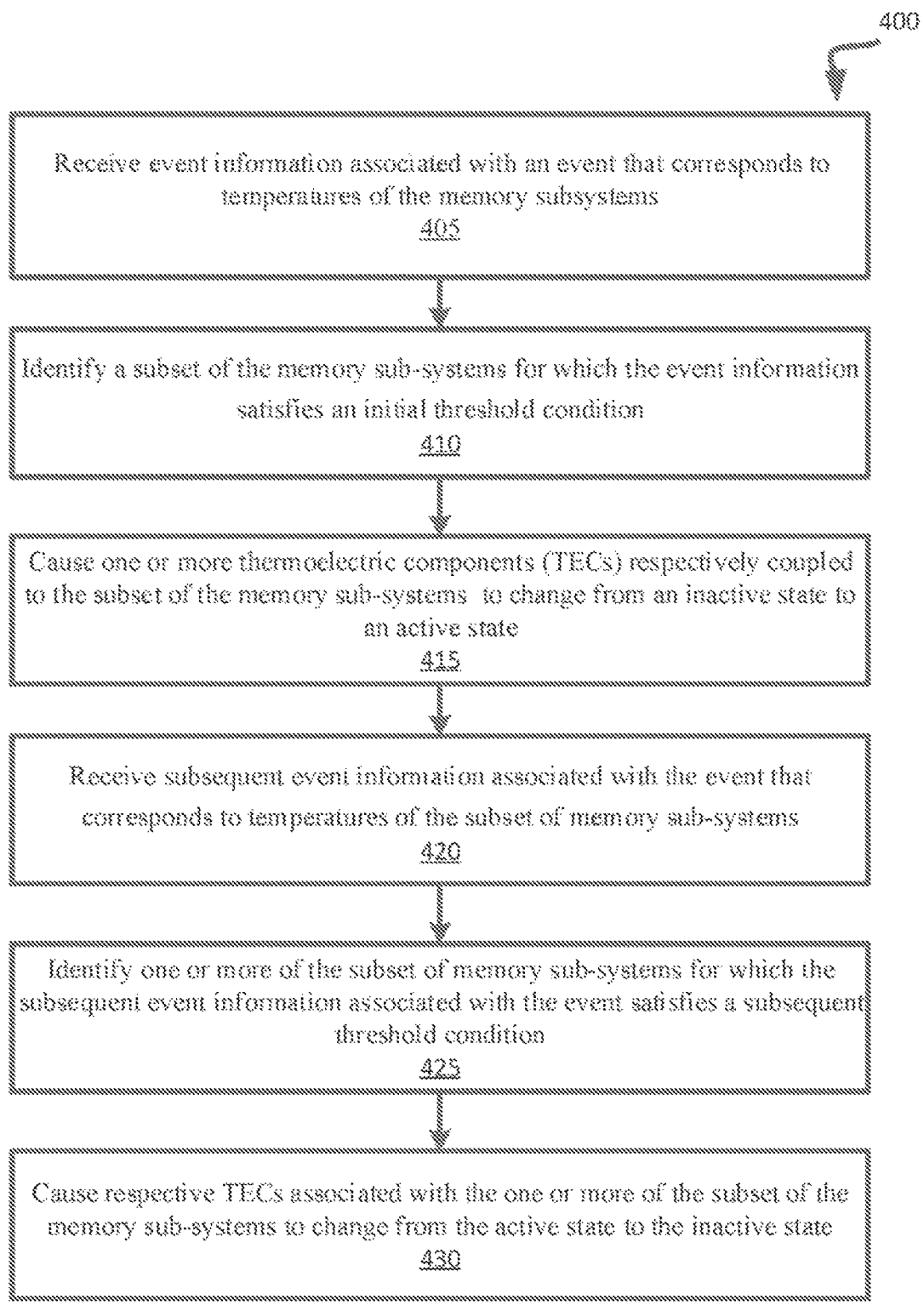
FIG. 4 is a flow diagram of an example method of causing respective TECs that are coupled to memory sub-systems to change from an inactive state to an active state and from an active state to an inactive state, in accordance with some embodiments of the disclosure.

FIG. 4 is a flow diagram of an example method of causing one or more TECs respectively coupled to a subset of memory sub-systems to change from an inactive state to an active state, in accordance with some embodiments of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 400 is performed by the temperature management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible In some embodiments, temperature management component 113 (e.g., firmware) executed at controller 115 of memory sub-system 110 performs some or all of the operations described with respect to method 400. In some embodiments, temperature management component 113 executed at host system 120 performs some or all of the operations described with respect to method 400. In some embodiments, temperature management component 113 of host system 120 can include in one or more different parts of the host system 120. In one example, temperature management component 113 can be executed as an application in user-space (e.g., third-party application) that is separate from the operating system (OS) (e.g., kernel space) of the host system 120. In another example, the temperature management component 113 can be part of the OS of the host system 120. In still another example, temperature management component 113 can be part of the memory sub-system device driver that is executed at the host system 120.

In some embodiments, a host system can be coupled to multiple memory sub-systems, where one or more of the memory sub-systems are in included in memory sub-system stack-ups. The memory sub-system stack-ups can include a memory sub-system coupled to a respective TEC. The respective TECs can be independently controlled from the other TEC in the memory sub-system stack-ups. An example of a host system that is coupled to multiple memory sub-system stack-ups is illustrated in FIG. 2B. Method 400 illustrates operations of independently causing respective TECs in multiple memory sub-system stack-ups to change from an inactive state to an active state, and vice versa. In can be noted that operations and elements of operations of method 300 of FIG. 3 can be applied to method 400.

At operation 405, processing logic receives event information associated with an event that corresponds to temperatures of the memory subsystems. Processing logic can receive event information associated with any number of memory sub-systems.

In some embodiments, to receive the event information associated with the event that corresponds to temperatures of the memory sub-systems, processing logic can receive indications of sub-system temperatures of the memory sub-systems.

In some embodiments, to receive the event information associated with the event that corresponds to temperatures of the memory sub-systems, processing logic can receive indications of component temperatures of memory components of the memory sub-systems. In some embodiments, to receive the event information associated with the event that corresponds to temperatures of the memory sub-systems, processing logic can receive an indication of a number of logical block addresses at which a memory operation at the memory sub-systems is to be performed.

At operation 410, processing logic can identify a subset of the memory sub-systems for which the event information satisfies an initial threshold condition.

In some embodiments, to identify a subset of the memory sub-systems for which the event information satisfies an initial threshold condition, processing logic can compare the indications of the sub-system temperatures of the memory sub-systems to a sub-system temperature threshold condition. Processing logic can determine whether any of the sub-system temperatures of the memory sub-systems satisfy the initial threshold condition based on the comparison. Processing logic can determine that sub-system temperatures of the subset of the memory sub-systems meet or exceed the sub-system temperature threshold condition. Satisfying the sub-system temperature threshold condition is further described above with respect to FIG. 3.

In some embodiments, to identify a subset of the memory sub-systems for which the event information satisfies an initial threshold condition, processing logic can compare the indications of the component temperatures of the memory components of the memory sub-systems to a component temperature threshold condition. Processing logic can determine that component temperatures of memory components of the subset of the memory sub-systems meet or exceed the component temperature threshold condition in view of the comparison. Satisfying the component temperature threshold condition is further described above with respect to FIG. 3.

In some embodiments, to identify a subset of the memory sub-systems for which the event information satisfies an initial threshold condition, processing logic can identify a group of the memory sub-systems at which the memory operation is to be performed. For each memory sub-systems of the group of memory sub-systems, processing logic can compare the number of logical block addresses at which the memory operation at a memory sub-system of the group of memory subsystems is to be performed to a number threshold condition. Processing logic can determine the number of logical block addresses associated with a subset of the group of memory sub-systems meets or exceeds the number threshold condition on view of the comparison. Satisfying the number threshold condition is further described above with respect to FIG. 3.

At operation 415, processing logic can cause one or more thermoelectric components (TECs) respectively coupled to the subset of the memory sub-systems to change from an inactive state to an active state. Changing from an inactive state to an active state can include decreasing temperatures at bottom surfaces of the one or more TECs that are respectively coupled to the subset of memory sub-systems as temperatures at top surfaces of the one or more TECs increase.

In some embodiments, processing logic can identify another subset of the memory sub-systems for which the event information does not satisfy the initial threshold condition. Processing logic can cause one or more TECs associated with the other subset of the memory sub-systems to maintain operation in an inactive state.

At operation 420, processing logic can receive subsequent event information associated with the event that corresponds to temperatures of the subset of memory sub-systems.

At operation 425, processing logic can identify one or more of the subset of memory sub-systems for which the subsequent event information associated with the event satisfies a subsequent threshold condition.

At operation 430, processing logic can cause respective TECs associated with the one or more of the subset of the memory sub-systems to change from the active state to the inactive state.

Figure 5:
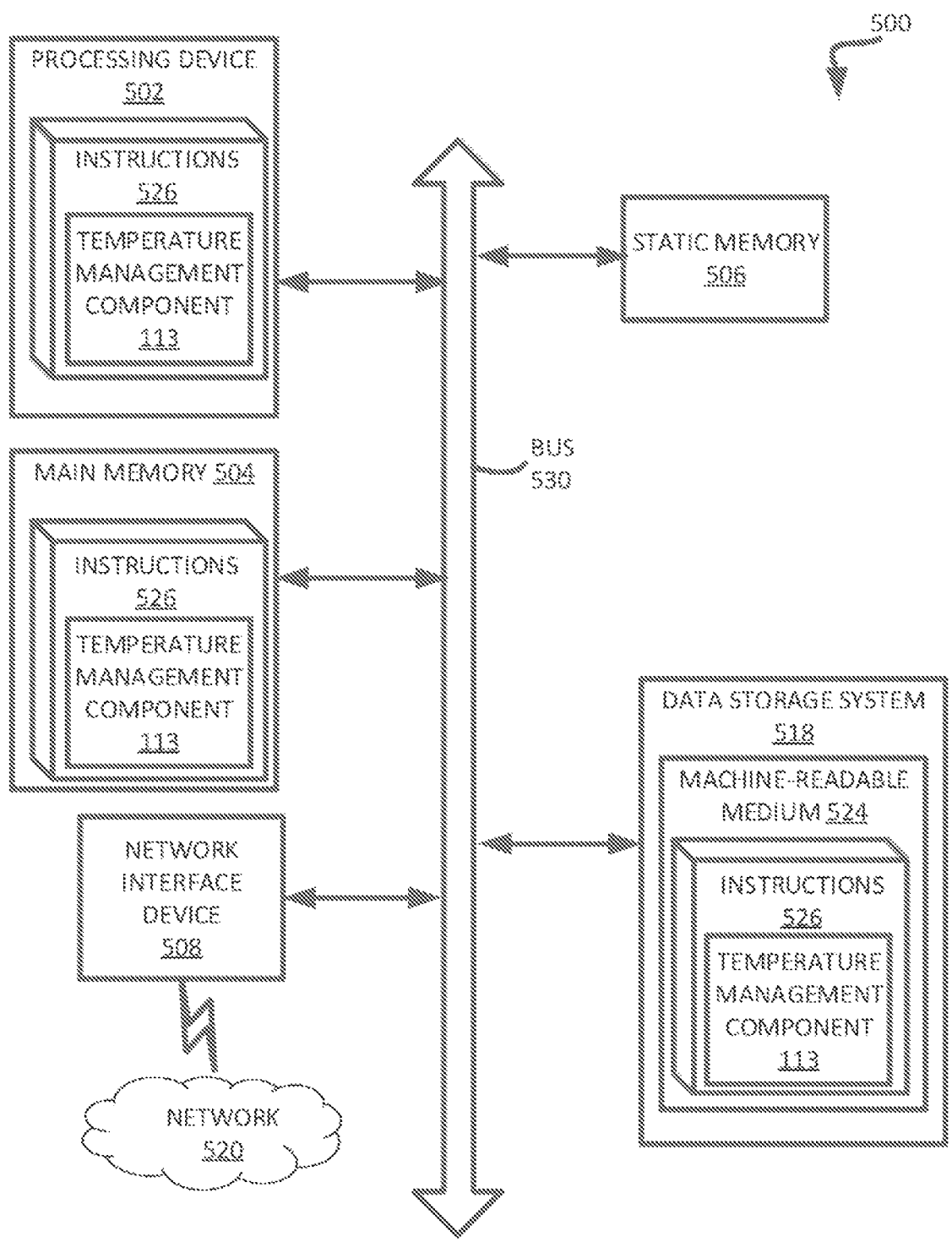
FIG. 5 illustrates an example machine of a computer system within which a set of instructions, for causing the machine to perform any one or more of the operations discussed herein, can be executed.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a non-transitory computer-readable storage medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the temperature management component 113 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory sub-system comprising:
      a plurality of memory devices encased in respective packages; and
      a processing device, coupled to the plurality of memory devices;
   a thermoelectric component (TEC) directly coupled to respective external surfaces of the plurality of memory devices encased in respective packages; and
   a heat sink component directly coupled to the TEC, wherein a first surface of the TEC is directly coupled to the respective external surfaces of the respective packages, and wherein a second surface of the TEC, opposite the first surface, is coupled to the heat sink component, the heat sink component to absorb thermal energy from the second surface of the TEC, and wherein the processing device of the memory sub-system is to perform operations comprising:
      receiving event information associated with an event that corresponds to a temperature of the memory sub-system, wherein receiving the event information associated with the event comprises receiving an indication of a number of logical block addresses at which a memory operation at the memory sub-system is to be performed;
      determining whether the event information associated with the event satisfies a threshold condition, wherein determining whether the event information associated with the event satisfies the threshold condition comprises:
         comparing the number of logical block addresses to a number threshold condition; and
         determining whether the number of logical block addresses meets or exceeds the number threshold condition in view of the comparing; and
      responsive to determining that the event information associated with the event satisfies the threshold condition, causing a voltage signal to be applied to the TEC, the voltage signal to cause the TEC to transfer thermal energy between the TEC and the plurality of memory devices via thermal conduction.

2. The system of claim 1, wherein the event information is initial event information, wherein the operations further comprising:
   receiving subsequent event information associated with the event that corresponds to the temperature of the memory sub-system;
   determining whether the subsequent event information associated with the event that corresponds to the temperature of the memory sub-system satisfies an additional threshold condition; and
   responsive to determining that the subsequent event information associated with the event that corresponds to the temperature of the memory sub-system satisfies the additional threshold condition, causing the TEC to change from an active state to an inactive state.

3. The system of claim 1, wherein the operations further comprising:
   responsive to determining that the event information associated with the event does not satisfy the threshold condition, monitoring for additional event information associated with the event that satisfies the threshold condition; and responsive to determining that the additional event information associated with the event satisfies the threshold condition, causing the TEC to change from an inactive state to an active state.

4. The system of claim 1, wherein receiving the event information associated with the event, comprises:
  receiving an indication of a sub-system temperature of the memory sub-system.

5. The system of claim 4, wherein determining whether the event information associated with the event satisfies the threshold condition, comprises:
  comparing the indication of the sub-system temperature of the memory sub-system to a sub-system temperature threshold condition; and
  determining whether the sub-system temperature of the memory sub-system meets or exceeds the sub-system temperature threshold condition in view of the comparing.

6. The system of claim 1, wherein receiving the event information associated with the event, comprises:
  receiving an indication of a component temperature of one or more of the plurality of memory devices of the memory sub-system.

7. The system of claim 6, wherein determining whether the event information associated with the event satisfies the threshold condition, comprises:
  comparing the indication of the component temperature of the one or more of the plurality of memory devices of the memory sub-system to a component temperature threshold condition; and
  determining whether the component temperature meets or exceeds the component temperature threshold condition in view of the comparing.

8. A method comprising:
  receiving, by a processing device, event information associated with an event that corresponds to a temperature of a memory sub-system comprising a plurality of memory devices encased in respective packages, wherein receiving the event information associated with the event comprises receiving an indication of a number of logical block addresses at which a memory operation at the memory sub-system is to be performed;
  determining whether the event information associated with the event satisfies a threshold condition, wherein determining whether the event information associated with the event satisfies the threshold condition comprises:
    comparing the number of logical block addresses to a number threshold condition; and
    determining whether the number of logical block addresses meets or exceeds the number threshold condition in view of the comparing; and
  responsive to determining that the event information associated with the event satisfies the threshold condition, causing a voltage signal to be applied to a thermoelectric component (TEC) that is directly coupled to a heat sink component, wherein a first surface of the TEC is directly coupled to the respective external surfaces of the respective packages, and wherein a second surface of the TEC, opposite the first surface, is coupled to the heat sink component, the heat sink component to absorb thermal energy from the second surface of the TEC, and to respective external surfaces of the respective packages of the plurality of memory devices of the memory sub-system, the voltage signal to cause the TEC to transfer thermal energy between the TEC and the plurality of memory devices via thermal conduction.

9. The method of claim 8, wherein the event information is initial event information, the method further comprising:
  receiving subsequent event information associated with the event that corresponds to the temperature of the memory sub-system;
  determining whether the subsequent event information associated with the event that corresponds to the temperature of the memory sub-system satisfies an additional threshold condition; and
  responsive to determining that the subsequent event information associated with the event that corresponds to the temperature of the memory sub-system satisfies the additional threshold condition, causing the TEC to change from an active state to an inactive state.

10. The method of claim 8, further comprising:
  responsive to determining that the event information associated with the event does not satisfy the threshold condition, monitoring for additional event information associated with the event that satisfies the threshold condition; and
  responsive to determining that the additional event information associated with the event satisfies the threshold condition, causing the TEC to change from an inactive state to an active state.

11. The method of claim 8, wherein receiving the event information associated with the event, comprises:
  receiving an indication of a sub-system temperature of the memory sub-system.

12. The method of claim 11, wherein determining whether the event information associated with the event satisfies the threshold condition, comprises:
  comparing the indication of the sub-system temperature of the memory sub-system to a sub-system temperature threshold condition; and
  determining whether the sub-system temperature of the memory sub-system meets or exceeds the sub-system temperature threshold condition in view of the comparing.

13. The method of claim 8, wherein receiving the event information associated with the event, comprises:
  receiving an indication of a component temperature of one or more of the plurality of memory devices of the memory sub-system.

14. The method of claim 13, wherein determining whether the event information associated with the event satisfies the threshold condition comprises:
  comparing the indication of the component temperature of the one or more of the plurality of memory devices of the memory sub-system to a component temperature threshold condition; and
  determining whether the component temperature meets or exceeds the component temperature threshold condition in view of the comparing.

15. A non-transitory computer-readable medium comprising instruction that, responsive to execution by a processing device, cause the processing device to perform operations comprising:
  receiving, by the processing device, event information associated with an event that corresponds to a temperature of a memory sub-system comprising a plurality of memory devices encased in respective packages, wherein receiving the event information associated with the event comprises receiving an indication of a number of logical block addresses at which a memory operation at the memory sub-system is to be performed;

determining whether the event information associated with the event satisfies a threshold condition, wherein determining whether the event information associated with the event satisfies the threshold condition comprises:

comparing the number of logical block addresses to a number threshold condition; and determining whether the number of logical block addresses meets or exceeds the number threshold condition in view of the comparing; and responsive to determining that the event information associated with the event satisfies the threshold condition, causing a voltage signal to be applied to a thermoelectric component (TEC) that is directly coupled to a heat sink component, wherein a first surface of the TEC is directly coupled to the respective external surfaces of the respective packages, and wherein a second surface of the TEC, opposite the first surface, is coupled to the heat sink component, the heat sink component to absorb thermal energy from the second surface of the TEC, and to respective external surfaces of the respective packages of the plurality of memory devices of the memory sub-system, the voltage signal to cause the TEC to transfer thermal energy between the TEC and the plurality of memory devices via thermal conduction.

16. The non-transitory computer-readable medium of claim 15, wherein the event information is initial event information, the operations further comprising:

receiving subsequent event information associated with the event that corresponds to the temperature of the memory sub-system;

determining whether the subsequent event information associated with the event that corresponds to the temperature of the memory sub-system satisfies an additional threshold condition; and responsive to determining that the subsequent event information associated with the event that corresponds to the temperature of the memory sub-system satisfies the additional threshold condition, causing the TEC to change from an active state to an inactive state.

* * * * *